(12) United States Patent
Maruyama et al.

(10) Patent No.: US 9,944,527 B2
(45) Date of Patent: Apr. 17, 2018

(54) METHOD FOR PRODUCING TWO-DIMENSIONALLY PATTERNED CARBON NANOTUBE AND TWO-DIMENSIONALLY PATTERNED CARBON NANOTUBE

(71) Applicant: The University of Tokyo, Bunkyo-ku, Tokyo (JP)

(72) Inventors: Shigeo Maruyama, Tokyo (JP); Rong Xiang, Guangzhou (CN)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 15/045,122

(22) Filed: Feb. 16, 2016

(65) Prior Publication Data

US 2016/0176712 A1   Jun. 23, 2016

Related U.S. Application Data

(62) Division of application No. 13/203,705, filed as application No. PCT/JP2010/053029 on Feb. 26, 2010, now abandoned.

(30) Foreign Application Priority Data

Feb. 27, 2009 (JP) ................................ 2009-046686

(51) Int. Cl.
| | |
|---|---|
| *G03F 7/40* | (2006.01) |
| *C01B 31/02* | (2006.01) |
| *B01J 23/28* | (2006.01) |
| *B01J 23/75* | (2006.01) |
| *B01J 23/882* | (2006.01) |
| *B01J 37/02* | (2006.01) |
| *B82Y 30/00* | (2011.01) |
| *B82Y 40/00* | (2011.01) |
| *G03F 7/20* | (2006.01) |
| *C01B 32/15* | (2017.01) |
| *C01B 32/162* | (2017.01) |
| *B01J 23/745* | (2006.01) |
| *B01J 23/755* | (2006.01) |

(52) U.S. Cl.
CPC .......... *C01B 31/0233* (2013.01); *B01J 23/28* (2013.01); *B01J 23/75* (2013.01); *B01J 23/882* (2013.01); *B01J 37/0217* (2013.01); *B01J 37/0228* (2013.01); *B82Y 30/00* (2013.01); *B82Y 40/00* (2013.01); *C01B 32/15* (2017.08); *C01B 32/162* (2017.08); *G03F 7/20* (2013.01); *G03F 7/2059* (2013.01); *G03F 7/40* (2013.01); *B01J 23/745* (2013.01); *B01J 23/755* (2013.01); *C01B 2202/02* (2013.01); *C01B 2202/04* (2013.01); *C01B 2202/08* (2013.01); *Y10T 428/24174* (2015.01); *Y10T 428/24893* (2015.01)

(58) Field of Classification Search
CPC ..................................... G03F 7/16; G03F 7/40
See application file for complete search history.

(56) References Cited

U.S. PATENT DOCUMENTS

| | | |
|---|---|---|
| 2001/0019238 A1 | 9/2001 | Dai et al. |
| 2004/0101469 A1 | 5/2004 | Demers |
| 2005/0079118 A1 | 4/2005 | Maruyama |
| 2005/0116861 A1 | 6/2005 | Anazawa et al. |
| 2006/0024227 A1 | 2/2006 | Maruyama |
| 2009/0075035 A1 | 3/2009 | O'Brien et al. |
| 2009/0146134 A1 | 6/2009 | Bo et al. |
| 2009/0286066 A1 | 11/2009 | Burke et al. |

FOREIGN PATENT DOCUMENTS

| | | |
|---|---|---|
| JP | 2005-219954 A | 8/2005 |
| WO | 03/068876 A1 | 8/2003 |

OTHER PUBLICATIONS

Fan, S., et al., "Self-Oriented Regular Arrays of Carbon Nanotubes and Their Field Emission Properties," Science 283(5401):512-514, Jan. 1999.

Huang, S., et al., "Controlled Fabrication of Large-Scale Aligned Carbon Nanofiber/Nanotube Patterns by Photolithography," Advanced Materials 14(16):1140-1143, Aug. 2002.

Takei, Y., et al., "Selective Growth of Carbon Nanotubes by Self-Assembled Monolayer Patterning," Proceedings of the 21st Sensor Symposium on Sensors, Micromachines, and Applied Systems, Kyoto, Oct. 14-15, 2004, pp. 151-154.

Wei, B.O., et al., "Organized Assembly of Carbon Nanotubes," Nature 416(6880):495-496, Apr. 2002.

Wei, H., et al., "Preferential Forest Assembly of Single-Wall Carbon Nanotubes on Low-Energy Electron-Beam Patterned Nafion Films," Chemistry of Materials 18(5):1100-1106, Mar. 2006.

Xiang, R., et al., "High-Precision Selective Deposition of Catalyst for Facile Localized Growth of Single-Walled Carbon Nanotubes," Journal of the American Chemical Society 131(30):10344-10345, Aug. 2009.

Xiang, R., et al., "Temperature Effect on the Substrate Selectivity of Carbon Nanotube Growth in Floating Chemical Vapor Deposition," Nanotechnology 18(41):415703, Oct. 2007, 8 pages (including 4 pages of supplementary data).

International Search Report dated May 11, 2010, issued in corresponding International Application No. JP/2010/053029, filed Feb. 26, 2010, 4 pages.

*Primary Examiner* — Kathleen Duda
(74) *Attorney, Agent, or Firm* — Christensen O'Connor Johnson Kindness PLLC

(57) ABSTRACT

Disclosed are a method for producing a carbon nanotube (CNT) whereby, in the local synthesis of CNTs, a high resolution, a low cost, easiness in production and mass production capability can be established at the same time; and a two-dimensionally patterned CNT obtained thereby.

22 Claims, 2 Drawing Sheets

US 9,944,527 B2

METHOD FOR PRODUCING TWO-DIMENSIONALLY PATTERNED CARBON NANOTUBE AND TWO-DIMENSIONALLY PATTERNED CARBON NANOTUBE

CROSS-REFERENCES TO RELATED APPLICATIONS

This application is a division of U.S. application Ser. No. 13/203,705, filed Aug. 26, 2011, which is the National Stage of International Application No. PCT/JP20101/053029, filed Feb. 26, 2010, the entire disclosures of which are hereby incorporated by reference herein.

TECHNICAL FIELD

The present invention relates to a method for producing a two-dimensionally patterned carbon nanotube on a substrate and a structure comprising a substrate and a carbon nanotube which is two-dimensionally patterned on the substrate.

BACKGROUND ART

Because of an excellent property of a carbon nanotube (CNT), in particular chiral-dependent electric conductivity of a single-walled carbon nanotube (SWNT), application thereof to a next generation nanodevice is expected. Since the step of manufacturing a device on a substrate is important, a technology of locally synthesizing CNT is attracting attention.

Conventionally, a catalyst has been patterned by sputtering or vapor-depositing a metal with a physical mask or a pre-exposure photoresist. These methods are effective but are generally complicated and expensive (see Non-Patent Document 1 or 2).

Another example of performing the CNT local synthesis may include ferrocene-based floating chemical vapor deposition (CVD) utilizing growth selectivity between $SiO_2$ and Si (or a metal). However, the floating CVD is not always capable of successfully obtaining SWNT on a substrate (see Non-Patent Document 3 or 4).

On the other hand, Patent Document 1 or 2, in which a part of the inventors of the present case is included in the inventors, discloses dip coating and discloses that it is possible to successfully synthesize a high quality randomly aligned or vertically aligned SWNT by alcohol catalyst CVD (ACCVD).

PRIOR ART

Patent Document

Patent document 1: WO2003/068676.
Patent document 2: US 2006/0024227 A1.

Non-Patent Document

Non-Patent document 1: Fan, S. S. et al., Science 1999, 283, 512.
Non-Patent document 2: Huang, S. M. et al., Adv. Mater. 2002, 14, 1140.
Non-Patent document 3: Wei, B. Q. et al., Nature 2002, 416, 495.
Non-Patent document 4: Xiang, R. et al., Nanotechnology 2007, 18, 415703.

DISCLOSURE OF THE INVENTION

Problems to be Solved by the Invention

However, the conventional methods disclosed in Non-Patent Documents 1 to 4 include multiple steps and do not simultaneously attain high resolution, low cost, easiness in production, and mass production.

On the other hand, the method disclosed in Patent Document 1 or 2 has high possibility to enable the simultaneous attainment of low cost, easiness in production, and mass production, but does not refer to the CNT local synthesis though it is.

An object of the present invention is to provide a CNT production method which enables the simultaneous attainment of high resolution, low cost, easiness in production, and mass production in the CNT local synthesis as well as a two-dimensionally patterned CNT obtained thereby.

Means for Solving Problems

The present inventors studied intensively in order to achieve the above objects, and have found following inventions:

<1> A method for producing a two-dimensionally patterned carbon nanotube, comprising the steps of:
  A) preparing a substrate;
  B) 1) covering the substrate with a mask and irradiating the substrate with an electromagnetic wave through the mask, in the presence or absence of electromagnetic wave irradiation without or with the mask, or
    2) irradiating the substrate with an electron beam in the presence or absence of the electron beam irradiation,
  to form a first two-dimensional pattern consisting of a hydrophobic surface and a hydrophilic surface on a surface of the substrate;
  C) applying a catalyst-containing liquid on the substrate having the first two-dimensional pattern, to form a second two-dimensional pattern, depending on the presence or absence of the catalyst, wherein the hydrophilic surface retains the catalyst and the hydrophobic surface does not retain the catalyst; and
  D) forming a carbon nanotube on the resulting substrate by chemical vapor deposition under the presence of a carbon source, wherein the carbon nanotube is formed on the surface retaining the catalyst and any carbon nanotube is not formed on the surface which does not retain the catalyst.

<2> In the above item <1>, the substrate in the step A) may be A') a substrate having the hydrophobic surface on its entire surface; and
  the step B) may be a step B)-1), and the step B)-1) may be a step B)-1') of covering the hydrophobic surface with a mask and irradiating the hydrophobic surface with an electromagnetic wave through the mask, thereby changing the hydrophobic surface which is not covered with the mask into a hydrophilic surface, and remaining a portion which is covered with the mask as the hydrophobic surface, to form the first two-dimensional pattern.

<3> In the above item <1> or <2>, the substrate in the step A) may be A') a substrate having the hydrophobic surface on its entire surface; and
  the step B) may be a step B)-2), and the step B)-2) may be a step B)-2') of irradiating the hydrophobic surface with an electron beam, thereby changing a portion irradiated with the electron beam into a hydrophilic surface, and remaining a portion which is not irradiated with the electron beam as the hydrophobic surface, to form the first two-dimensional pattern.

<4> In any one of the above items <1> to <3>, the substrate having the hydrophobic surface on its entire surface in the step A') may be prepared by a step of E)-1) preparing a substrate having a hydrophilic surface on its entire surface and then E)-2) applying a surface hydrophobication solution on the hydrophilic surface thereby to change an entire portion of the hydrophilic surface into a hydrophobic surface.

In particular, <4-1> in the above item <2>, the substrate having the hydrophobic surface on its entire surface in the step A') may be prepared by the steps E)-1) and E)-2).

<5> In the above item <4> or <4-1>, the step E)-1) may further comprise a step E)-1)-1) of cleaning the surface of the substrate having the hydrophilic surface on its entire surface. Furthermore, for the step of cleaning, conventionally well known technique may be used to eliminate organic matter existing on the substrate.

<6> In the above item <5>, the step E)-1)-1) may further comprise a step a) of sintering the substrate having the hydrophilic surface on its entire surface under the presence of oxygen at 300° C. or more.

<7> In the above item <5> or <6>, the step E)-1)-1) may further comprise a step b) of cleaning the substrate having the hydrophilic surface on its entire surface with a mixture solution of a $NH_3$ aqueous solution and a hydrogen peroxide aqueous solution at 80° C. or less, preferably 70 to 80° C.

<8> In any one of the above items <4> to <7>, the surface hydrophobication solution may comprise a silane compound represented by $R^1$—Si—$X^1_m X^2_{(3-m)}$, wherein $R^1$ represents an organic group having C10-20 linear or branched chain; $X^1$ and $X^2$ each represents —$OCH_3$ or —Cl; and m represents an integer of 0 to 3. The solvent of the solution is not particularly limited as long as the solvent dissolves the silane compound. Furthermore, the solvent may preferably have volatility in terms of production.

<9> In any one of the above items <1> to <8>, the substrate prepared in the step A), A'), or E)-1) may be Si, quartz, crystal, or sapphire each having $SiO_2$ on its surface.

<10> In any one of the above items <1> to <9>, a hydrophilicity of the hydrophilic surface in the step B) may be represented by a water contact angle of 10° or less, preferably 5° or less, more preferably 0° or less.

<11> In any one of the above items <1> to <10>, a hydrophobicity of the hydrophobic surface in the step B) may be represented by a water contact angle of 90° or more, preferably 100° or more, more preferably 110° or more.

<12> In any one of the above items <1> to <11>, the electromagnetic wave irradiation in the step B)-1) may be UV ray irradiation.

<13> In any one of the above items <1> to <12>, the catalyst-containing liquid in the step C) may comprise salt of at least one metal selected from the group consisting of Fe, Co, Ni and Mo. In particular the liquid may be a solution containing a salt consisting of Co salt, a solution containing salts of Co and Mo, a solution containing salts of Fe and Co, a solution containing salts of Fe and Ni, or a solution containing salts of Ni and Co, preferably the solution containing the salt consisting of Co salt or the solution containing salts of Co and Mo. The salt may be an acetate salt, a nitrate salt, a chloride salt, or an ammonium salt, such as cobalt acetate, molybdenum acetate, or ammonium dimolybdate (($NH_4$)$_2Mo_2O_7$). The solvent of the solution may be a lower alcohol dissolving the salts such as methanol, ethanol, and propanol, preferably ethanol.

<14> In any one of the above items <1> to <13>, the method may further comprise a step F) of sintering the substrate having the second two-dimensional pattern after the step C) and before the step D).

<15> In the above item <14>, the step F) may be performed under atmospheric environment at 300° C. or more, preferably 400° C. or more.

<16> In any one of the above items <1> to <15>, the carbon source in the step D) may be a lower alcohol, preferably methanol, ethanol or propanol, more preferably ethanol, and the chemical vapor deposition may be performed under a reduced pressure, preferably at 3 kPa or less, more preferably at 1.3 kPa or less, and a vapor deposition temperature of 500° C. or more, preferably 700° C. or more, more preferably 800° C. or more.

<17> In any one of the above items <1> to <16>, the carbon nanotube may be a few-walled carbon nanotube. The term "few-walled" used herein means having three or less wall(s).

<18> In any one of the above items <1> to <16>, the carbon nanotube may be a single-walled carbon nanotube.

<19> In any one of the above items <1> to <18>, an axis direction of the carbon nanotube may be aligned perpendicular to the substrate.

<20> In any one of the above items <1> to <19>, an axis direction of the carbon nanotube may be aligned parallel to the substrate.

<21> In any one of the above items <1> to <20>, the carbon nanotube may have an average diameter of 3 nm or less, preferably 1.5 nm or less.

<22> In any one of the above items <1> to <21>, the two-dimensionally patterned carbon nanotube may have 15 µm or less, specifically 300 nm or less, preferably 200 nm or less, more preferably 100 nm or less, further preferably 50 nm or less, most preferably 10 nm or less of a possible-smallest-line-width at a portion where the carbon nanotube is disposed, while a possible-smallest-line-width at a portion where the carbon nanotube is not disposed may have 15 µm or less, specifically 300 nm or less, preferably 200 nm or less, more preferably 100 nm or less, further preferably 50 nm or less, most preferably 10 nm or less.

<23> A structure comprising a substrate and a two-dimensionally patterned carbon nanotube formed on the substrate.

<24> In the above item <23>, the substrate may be Si, quartz, crystal, or sapphire each having $SiO_2$ on its surface.

<25> In the above item <23> or <24>, the carbon nanotube may be a few-walled carbon nanotube.

<26> In any one of the above items <23> to <25>, the carbon nanotube may be a single-walled carbon nanotube.

<27> In any one of the above items <23> to <26>, an axis direction of the carbon nanotube may be aligned perpendicular to the substrate.

<28> In any one of the above items <23> to <27>, an axis direction of the carbon nanotube may be aligned parallel to the substrate.

<29> In any one of the above items <23> to <28>, the carbon nanotube may have an average diameter of 3 nm or less, preferably 1.5 nm or less.

<30> In any one of the above items <23> to <29>, the two-dimensionally patterned carbon nanotube may have 15 µm or less, specifically 300 nm or less, preferably 200 nm or less, more preferably 100 nm or less, further preferably 50 nm or less, most preferably 10 nm or less of a possible-smallest-line-width at a portion where the carbon nanotube is disposed, while a possible-smallest-line-width at a portion where the carbon nanotube is not disposed may have 15 µm or less, specifically 300 nm or less, preferably 200 nm or less, more preferably 100 nm or less, further preferably 50 nm or less, most preferably 10 nm or less.

Effects of the Invention

The present invention can provide a CNT production method which enables the simultaneous attainment of high resolution, low cost, easiness in production, and mass production in the CNT local synthesis as well as a two-dimensionally patterned CNT obtained thereby.

EMBODIMENTS FOR CARRYING OUT THE INVENTION

Figure 1:
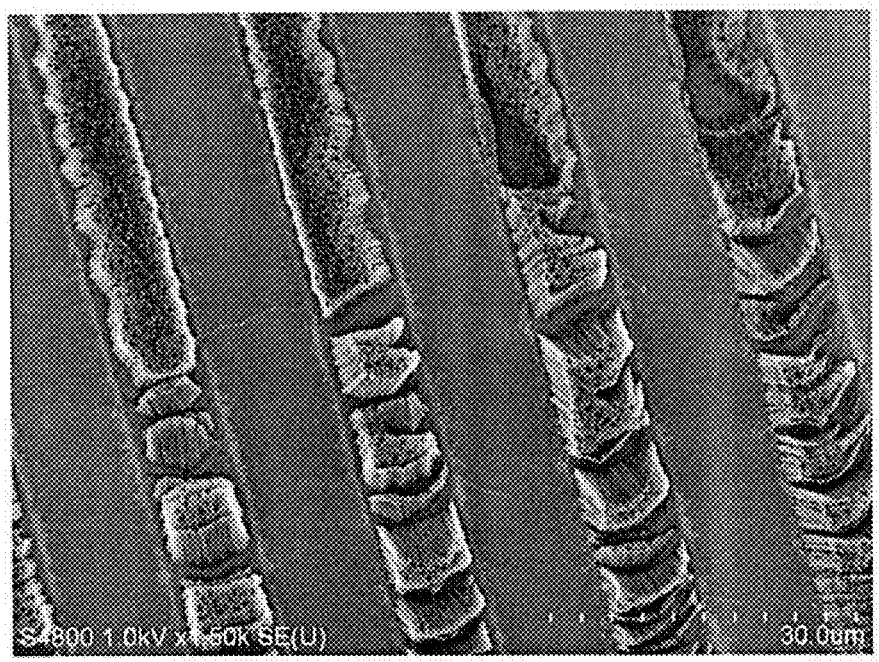
FIG. 1 shows an SEM image of two-dimensionally patterned single-walled carbon nanotubes of Example 1, in particular, vertically aligned single-walled carbon nanotubes which are synthesized by setting a catalyst portion line width: 5 μm and a clearance: 10 μm.

Hereinafter, the present invention will be described in detail.

The present invention provides a method for producing a two-dimensionally patterned carbon nanotube on a substrate. Further, the present invention provides a structure comprising a substrate and a carbon nanotube which is two-dimensionally patterned on the substrate. Furthermore, the substrate may be mainly obtained by the method.

Hereinafter, the production method and the structure according to the present invention will be described in this order.

<Method for Producing Two-Dimensionally Patterned Carbon Nanotube on Substrate>

The method for producing a two-dimensionally patterned carbon nanotube on a substrate according to the present invention comprises the steps of:

A) preparing a substrate;

B) 1) covering the substrate with a mask and irradiating the substrate with an electromagnetic wave through the mask, in the presence or absence of electromagnetic wave irradiation without or with the mask, or 2) irradiating the substrate with an electron beam in the presence or absence of the electron beam irradiation, to form a first two-dimensional pattern consisting of a hydrophobic surface and a hydrophilic surface on a surface of the substrate;

C) applying a catalyst-containing liquid on the substrate having the first two-dimensional pattern, to form a second two-dimensional pattern, depending on the presence or absence of the catalyst, wherein the hydrophilic surface retains the catalyst and the hydrophobic surface does not retain the catalyst; and D) forming a carbon nanotube on the resulting substrate by chemical vapor deposition under the presence of a carbon source, wherein the carbon nanotube is formed on the surface retaining the catalyst and any carbon nanotube is not formed on the surface which does not retain the catalyst.

<<Step A>>

The step A) according to the present invention is a step of preparing a substrate.

The substrate may be Si, quartz, crystal, or sapphire each having $SiO_2$ on its surface.

In the substrate to be prepared, a surface on which the carbon nanotube is to be formed may be hydrophobic or hydrophilic. Further, a part of the surface of the substrate may be hydrophobic with the rest being hydrophilic.

In this case, an operation of imparting a hydrophobicity or a hydrophilicity to an entire surface may preferably be performed.

The substrate to be prepared may have A') a hydrophobic surface on an entire surface of the surface on which the carbon nanotube is to be formed or E-1) a hydrophilic surface on the entire surface. Furthermore, a processing to be performed later on may be somewhat varied by having the hydrophobic surface A') or the hydrophilic surface E-1) on the entire surface.

<<Step B)>>

The step B) according to the present invention is a step of forming a desired first two-dimensional pattern consisting of the hydrophobic surface and the hydrophilic surface on the substrate surface.

The term "desired" used herein means that a possible-smallest-line-width of the hydrophobic surface is 15 μm or less, specifically 300 nm or less, preferably 200 nm or less, more preferably 100 nm or less, further preferably 50 nm or less, most preferably 10 nm or less and a possible-smallest-line-width of the hydrophilic surface is 15 μm or less, specifically 300 nm or less, preferably 200 nm or less, more preferably 100 nm or less, further preferably 50 nm or less, most preferably 10 nm or less.

Further, a water contact angle indicating the hydrophilicity of the hydrophilic surface may be 10° or less, preferably 5° or less, more preferably 0° or less.

On the other hand, a water contact angle indicating the hydrophobicity of the hydrophobic surface may be 90° or more, preferably 100° or more, more preferably 110° or more.

Furthermore, the term "water contact angle" used herein means "water contact angle" which is conveniently used as a simple scale for a degree of a surface energy of a substrate surface, and "water contact angle of 0° or less" means that the surface energy is "0° or less" when the water contact angle is used as the scale.

A step used in the step B) is slightly varied depending on the surface of the substrate prepared in the step A), and the step B) is a step of 1) covering the substrate with a mask and irradiating the substrate with an electromagnetic wave through the mask, in the presence or absence of electromagnetic wave irradiation without or with the mask, or 2) irradiating the substrate with an electron beam in the presence or absence of the electron beam irradiation, to form a first two-dimensional pattern consisting of a hydrophobic surface and a hydrophilic surface on a surface of the substrate.

The electromagnetic wave, depending on the substrate to be used, components forming the hydrophobic surface, and the like, may generally be an electromagnetic wave having a wavelength of 400 nm or less, preferably 300 nm or less, i.e., a UV ray.

Furthermore, as the electromagnetic wave irradiation and the electromagnetic beam irradiation methods, conventional methods may be employed. For example, deep UV lithography or X-ray lithography may be employed for the electromagnetic irradiation in the case of, for example, approximating the minimum line width to the possible-smallest-line-width, and, for example, electron beam lithography or an electron beam lithography device may be used for the electron beam irradiation.

In the step A), in a case where A') the substrate having the hydrophobic surface on the entire surface is prepared, the step B)-1) may be performed, i.e., the substrate may be covered with the mask, and the substrate may be irradiated with the electromagnetic wave. A portion which is not covered with the mask, i.e., the portion irradiated with the electromagnetic wave, becomes the hydrophilic surface, while a portion which is not covered with the mask is not irradiated with the electromagnetic wave to maintain the hydrophobic surface. It is possible to form the desired first two-dimensional pattern by the mask and the electromagnetic wave irradiation.

Further, in the step A), in the case where A') the substrate having the hydrophobic surface on the entire surface is prepared, the step B)-2) is performed, i.e., the substrate may be irradiated with the electron beam. In this case, a portion which is irradiated with the electron beam becomes the hydrophilic surface, while the hydrophobic surface is maintained in a portion which is not irradiated with the electron beam. It is possible to form the desired first two-dimensional pattern by the electron beam irradiation.

Furthermore, it is possible to use the step B)-1) and the step B)-2) in combination as required.

In the step A), in a case where E)-1) the substrate having the hydrophilic surface on the entire surface is prepared, the step E)-2) may be performed, i.e., the substrate may be subjected to the step of applying a surface hydrophobication solution on the hydrophilic surface, thereby to change the entire hydrophilic surface into the hydrophobic surface.

Furthermore, in a case where E)-1) the substrate having the hydrophilic surface on the entire surface is prepared, a step of cleaning the surface may be included in order to ensure the hydrophilicity.

Examples of the cleaning treatment, depending on the substrate to be used and the like, may include, but are not limited to, high temperature sintering cleaning, cleaning with ammonia and hydrogen peroxide solution, $O_2$ plasma cleaning, cleaning with strong acid (such as sulfuric acid, and sulfuric acid and $KMnO_4$), UV excimer cleaning, low pressure mercury cleaning, alkali cleaning, supersonic cleaning, megasonic cleaning, corona treatment, glow cleaning, scrub cleaning, ozone cleaning, hydrogen water cleaning, microbubble cleaning, fluorine cleaning and the like.

In particular, the cleaning step may include a step a) of sintering the substrate having the hydrophilic surface on its entire surface at 300° C. or more under the presence of oxygen and/or may include a step b) of cleaning the substrate having the hydrophilic surface on its entire surface with a mixture solution of a $NH_3$ aqueous solution and a hydrogen peroxide aqueous solution at 80° C. or less, preferably 70° C. to 80° C., and it is preferable to perform the step a) and then the step b).

The surface hydrophobication solution in the step E)-2) may contain a silane compound represented by $R^1$—Si—$X^1{}_m X^2{}_{(3-m)}$.

$R^1$ in the silane compound represents a C10-20 linear or branched chain, preferably linear alkyl group, linear alkenyl group or linear alkynyl group. The alkyl group, the alkenyl group, or the alkynyl group may partially be substituted by F.

$X^1$ and $X^2$ in the silane compound each represents —$OCH_3$ or —Cl, and m represents an integer of 0 to 3.

Examples of the silane compound may include, but are not limited to, undecyltrichlorosilane, tetradecyltrichlorosilane, octadecyltrichlorosilane, octadecyltrimethoxysilane, octadecylmethoxydichlorosilane, n-dodecyltrimethoxysilane and the like.

Further, a solvent for the surface hydrophobication solution is not particularly limited as long as the solvent dissolves the silane compound. The solvent may preferably have volatility in terms of production.

Examples of the solvent may include, but are not limited to, toluene, hexane, heptane and the like.

The surface hydrophobication solution may preferably be a solution of octadecyltrichlorosilane in toluene.

As a method for applying the surface hydrophobication solution, various conventional methods may be employed. Examples of the applying method may include, but are not limited to, dip coating, spin coating, cast coating, spray coating and the like.

The substrate having the hydrophobic surface on its entire surface obtained in the step E)-2) is subsequently subjected to the above-described step B)-1) and/or the step B)-2), to form the desired first two-dimensional pattern.

Furthermore, in the method according to the present invention, the "hydrophilic surface" and the "hydrophobic surface" can microscopically be observed as the "surface having —OH groups directly on the substrate surface" and the "surface particularly having organic groups other than —OH groups on its surface". Therefore, in the present application, it is reasonable to consider the "hydrophilic surface" as the "surface having —OH groups directly on the substrate surface" and the "hydrophobic surface" as the "surface particularly having organic groups other than —OH groups on its surface", and the same applies to and after the step B).

For example, the step of applying the surface hydrophobication solution in the step E)-2) to change the "hydrophilic surface" into the "hydrophobic surface" can be understood as a step of changing the "surface having —OH groups directly on the substrate surface" into the "surface having organic group on its surface" such as —O—Si—$R^1$ by a reaction of the silane compound contained in the surface hydrophobication solution with the —OH group on the substrate surface.

<<Step C>>

The step C) according to the present invention is a step of applying a catalyst-containing liquid on the substrate having the surface having the first two-dimensional pattern obtained in the step B), to form a desired second two-dimensional pattern depending on the presence or absence of a catalyst, in which the "hydrophilic surface" or the "surface having —OH groups directly on the substrate surface" is allowed to retain the catalyst while the "hydrophobic surface" or the "surface particularly having organic groups other than —OH groups on its surface" is not allowed to retain the catalyst.

The catalyst-containing liquid may contain at least one metal salt selected from the group consisting of Fe, Co, Ni, and Mo, depending on the substrate to be used, the silane compound and the solvent in the case of using the surface hydrophobication solution and the like.

In particular, the catalyst-containing liquid may be a solution containing a salt consisting of a Co salt, a solution containing salts of Co and Mo, a solution containing salts of Fe and Co, a solution containing salts of Fe and Ni, or a solution containing salts of Ni and Co, preferably the solution containing a salt consisting of a Co salt or the solution containing salts of Co and Mo.

The salt may be an acetate salt, a nitrate salt, a chloride salt, or an ammonium salt, such as cobalt acetate, molybdenum acetate, or ammonium dimolybdate (($NH_4)_2Mo_2O_7$).

A solvent of the catalyst-containing liquid may be a lower alcohol dissolving the salt such as methanol, ethanol, and propanol, preferably ethanol.

Preferably, the catalyst-containing liquid may be an ethanol solution of cobalt acetate or both of the ethanol solution of cobalt acetate and an ethanol solution of molybdenum acetate. In a case of using both of the ethanol solution of cobalt acetate and the ethanol solution of molybdenum acetate, the ethanol solution of cobalt acetate may be applied after applying and drying the ethanol solution of molybdenum acetate.

As a method of applying the catalyst-containing liquid, various conventional methods may be employed. Examples of the applying method may include, but are not limited to, dip coating, spin coating, cast coating, spray coating and the like.

Furthermore, it is microscopically considered that, in the step C), the metal specie M contained in the catalyst-containing liquid is reacted with the "hydrophilic surface", i.e., the "surface having —OH groups directly on the substrate surface", to form a group, for example, represented by the "—OM" and the like on the "hydrophilic surface", and to form the monomolecular layer of the catalyst, while the catalyst is not retained on the "hydrophobic surface" since the reaction is not caused. Due to the presence or absence of the catalyst, it is possible to form a two-dimensional pattern of carbon nanotube formation or non-formation in the step D).

After the step C) and before the step D), the method may further comprise a step F) of sintering a substrate having a second two-dimensional pattern. The step F) can be considered as a reaction which accelerates the above-described reaction, i.e., the formation of "—OM" and the like. The step F) may be performed under atmospheric environment at 300° C. or more, preferably 400° C.

<<Step D)>>

The step D) according to the present invention is a step of forming a carbon nanotube on the surface obtained in the step C) having the desired two-dimensional pattern depending on the presence or absence of the catalyst. More specifically, the carbon nanotube is formed on the surface retaining the catalyst, while any carbon nanotube is not formed on the surface which does not retain the catalyst, thereby to obtain the two-dimensionally patterned carbon nanotube.

The step D) is a step of forming the carbon nanotube on the surface retaining the catalyst and not forming the carbon nanotube on the surface which does not retain the catalyst by chemical vapor deposition (CVD) under the presence of a carbon source.

The step D) may be performed by a method, for example, as described in Patent Document 1 (WO2003-068676) or Patent Document 2 (US 2006/0024227 A1) (whole contents of which are incorporated herein by reference).

More specifically, a carbon source in the step D) may be a lower alcohol, preferably methanol, ethanol, or propanol, more preferably ethanol. CVD may be performed under a reduced pressure, preferably at 3 kPa or less, more preferably at 1.3 kPa or less and at a vapor deposition temperature of 500° C. or more, preferably 700° C. or more, more preferably 800° C. or more.

The carbon nanotube obtained by the method according to the present invention may be a few-walled carbon nanotube though it is possible to obtain various carbon nanotubes. Among the above, a single-walled carbon nanotube is preferred. The term "few-walled" used herein means having three or less wall(s).

In the carbon nanotube obtained by the method according to the present invention, an axis direction of the carbon nanotube may be aligned perpendicular to the substrate, depending on a production method and/or application of the carbon nanotube. Further, in the carbon nanotube obtained by the method according to the present invention, an axis direction of the carbon nanotube may be aligned parallel to the substrate, depending on a production method and/or application of the carbon nanotube.

The carbon nanotube obtained by the method according to the present invention may have an average diameter of 3 nm or less, preferably 1.5 nm or less.

The two-dimensionally patterned carbon nanotube obtained by the method according to the present invention may have a possible-smallest-line-width on which the carbon nanotube is placed of 15 µm or less, more specifically 300 nm or less, preferably 200 nm or less, more preferably 100 nm or less, further preferably 50 nm or less, most preferably 10 nm or less, while a possible-smallest-line-width on which the carbon nanotube is not placed may be 15 µm or less, more specifically 300 nm or less, preferably 200 nm or less, more preferably 100 nm or less, further preferably 50 nm or less, most preferably 10 nm or less.

As described above, the present invention enables not only the above-described effect, i.e., the simultaneous attainment of high resolution, low cast, easiness in production, and mass production but also enables to reduce the possible-smallest-line-width. Therefore, the two-dimensionally patterned carbon nanotube obtained by the present invention is applicable to various usages.

<Structure Comprising Substrate and Carbon Nanotube Two-Dimensionally Patterned on Substrate>

The present invention provides a structure comprising a substrate and a two-dimensionally patterned carbon nanotube on the substrate.

The structure may be prepared by, for example, the above-described production method.

The substrate of the structure according to the present invention may be the above-described substrate, i.e., Si, quartz, crystal, or sapphire each having $SiO_2$ on its surface.

The carbon nanotube of the structure according to the present invention may be i) a few-walled carbon nanotube. Among the above, i') a single-walled carbon nanotube is preferred.

In the carbon nanotube of the structure according to the present invention, ii)-a) an axis direction of the carbon nanotube may be aligned perpendicular to the substrate, depending on application of the carbon nanotube. Alternatively, ii)-b) an axis direction of the carbon nanotube may be aligned parallel to the substrate, depending on application of the carbon nanotube.

The carbon nanotube of the structure according to the present invention may have iii) an average diameter of 3 nm or less, preferably 1.5 nm or less.

The structure according to the present invention may have iv) a possible-smallest-line-width on which the carbon nanotube is placed of 15 µm or less, more specifically 300 nm or less, preferably 200 nm or less, more preferably 100 nm or less, further preferably 50 nm or less, most preferably 10 nm or less, while a possible-smallest-line-width on which the carbon nanotube is not placed may be 15 µm or less, more specifically 300 nm or less, preferably 200 nm or less, more preferably 100 nm or less, further preferably 50 nm or less, most preferably 10 nm or less.

In particular, the structure according to the present invention may satisfy two or more, preferably three or more, more preferably all of the requirements i) to iv).

<Utilities of the Structure>

It is possible to use the structure according to the present invention for various utilities. Examples of the utilities may include, but are not limited to, various sensors such as a temperature sensor, a pressure sensor, an optical sensor, an acceleration sensor, and a biochip sensor combined with fluorescence; transparent electric conductive films; polarizing filters; emission/absorption films; field emitter transistors (FETs); fuel modifiers; gas absorbing agents; and the like.

Hereinafter, the present invention will be illustrated by way of Examples, but is not limited thereto.

EXAMPLE 1

<Substrate Sintering Step>

In order to eliminate possibility of organic pollution, an Si/SiO$_2$ substrate having a SiO$_2$ layer of 50 nm (available from SUMCO Corporation; size: 25 mm×50 mm×0.5 mm) was sintered in air for 5 minutes, followed by cooling to a room temperature. A water contact angle of the surface was about 5°.

<Substrate Cleaning Step>

An SC1 solution was prepared. The SC1 solution was a mixture obtained by mixing H$_2$O, ammonium water (~28% NH$_3$ aqueous solution), and hydrogen peroxide (~30% H$_2$O$_2$ aqueous solution) at a volume ratio of 5:1:1.

The sintered substrate obtained as described above was cleaned by using the SC1 solution at 75° C. for 5 minutes and then rinsed with deionized water, followed by drying under air or nitrogen gas. A water contact angle of the thus-obtained surface was about 0°.

<Self-Assembled Monolayer (SAM) Formation Step>

An SAM solution was prepared. The SAM solution was a 65 ppm solution of octadecyltrichlorosilane (OTS) in toluene. The cleaned substrate obtained as described above was immersed into the SAM solution for 15 minutes and then rinsed with toluene or isopropanol. The surface modified by the SAM solution had a water contact angle of about 110°, which was very hydrophobic. However, the concentration of the SAM solution, the immersion period, and the like are not strict, and the immersion period can be changed depending on the concentration of the OTS solution to be used. Although the quality of SAM obtained by such OTS solution was changed, a water contact angle was substantially unchanged.

<UV Ray Irradiation Step>

The SAM-formed substrate obtained as described above was exposed to a UV ray (generated by an ordinary surface cleaner or a VUV) having a wavelength of 254 nm via a mask (a Cr glass mask formed by ordinary electron beam lithography). An exposure period was about 10 minutes (changeable depending on the intensity) with light intensity of 18 mW/cm$^2$. A patterned surface was formed, in which a water contact angle of an exposed portion was about 0° while a water contact angle of an unexposed portion (masked portion) was about 110°.

<Catalyst Applying Step>

A catalyst for growth of a single-walled carbon nanotube was prepared by dip coating. More specifically, an ethanol solution of 0.01 wt % cobalt acetate (w or w/o molybdenum acetate) (wt % is changeable as desired) was prepared.

The substrate obtained in <UV Ray Irradiation Step> was immersed into the solution for 0 to 10 minutes and then taken out at a rate of 6 cm/min by using a motor. The substrate was dried (ordinarily for 10 seconds or less), followed by sintering in air at 400° C. for 5 minutes. Furthermore, the dip coating included 2 stages. Molybdenum acetate was used first, and then cobalt acetate was used. The first dip coating (i.e., dip coating using the ethanol solution of molybdenum acetate) was performed, followed by drying, and then the second dip coating (i.e., dip coating using the ethanol solution of cobalt acetate) was performed without sintering. After that, the substrate was sintered in air at 400° C. for 5 minutes.

<Step of CVD Growth of Single-Walled Carbon Nanotube>

CVD growth of the single-walled carbon nanotube was performed in a quartz tube by employing the ACCVD method disclosed in Patent Document 2 (US 2006/0024227 A1).

More specifically, the substrate obtained in the above-described <Catalyst Coating Step> was placed at the center of the quartz tube, and the chamber was purged with argon/H$_2$ (3 vol % H$_2$) at 1.0 kPa and 300 sccm for 5 minutes. Then, the quartz tube was heated up to 800° C. for 30 minutes and retained at 800° C. for 10 minutes.

Subsequently, the chamber was evacuated in vacuo, and ethanol was introduced at 450 sccm and a pressure of 1.3 kPa and maintained for 3 minutes.

Thus, a two-dimensionally patterned single-walled carbon nanotube shown in FIG. 1 was obtained. FIG. 1 shows that perpendicularly aligned single-walled carbon nanotubes have a catalyst portion line width of 5 µm and a clearance of 10 µm.

Figure 2:
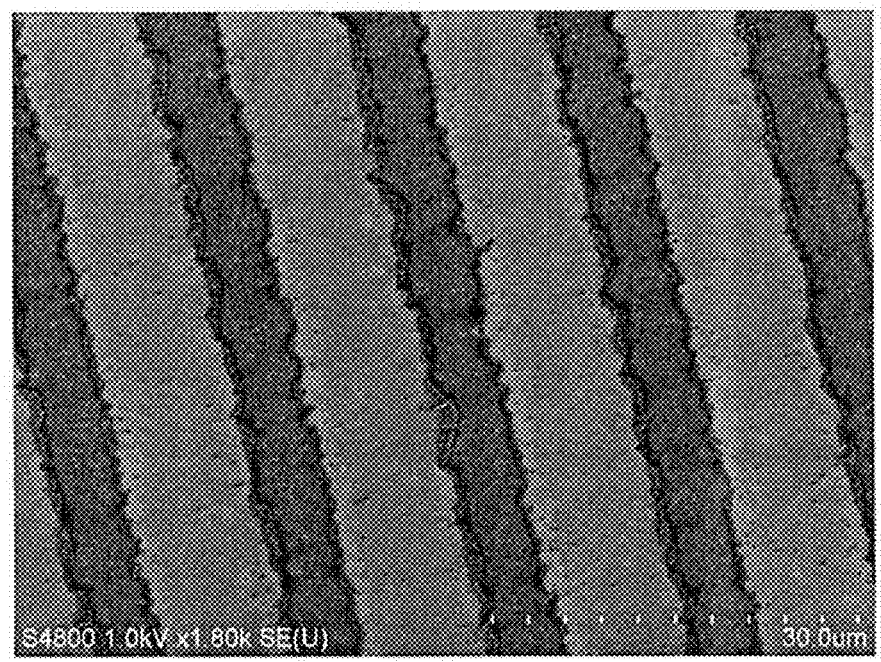
FIG. 2 shows an SEM image of two-dimensionally patterned single-walled carbon nanotubes of Example 1, in particular, randomly aligned single-walled carbon nanotubes which are synthesized by setting a catalyst portion line width: 5 μm and a clearance: 10 μm.

Further, randomly aligned single-walled carbon nanotubes which were synthesized to attain a catalyst portion line width of 5 µm and a clearance of 10 µm as shown in FIG. 2 were obtained in the same manner as in the above-described method except for reducing the catalyst amount of the above-described <Catalyst Coating Step> and using cobalt acetate alone. FIGS. 1 and 2 show that an average diameter of the carbon nanotubes is 1.5 nm. More, FIGS. 1 and 2 show that a minimum line width in a two-dimensionally patterned carbon nanotube formation region was 5 µm, while a minimum line width in a carbon nanotube non-formation region is 10 µm.

EXAMPLE 2

<Electron Beam Irradiation Step>

A patterned surface was formed on the SAM-formed substrate obtained in a manner similar to the <SAM Formation Step> of Example 1, in which a portion exposed to an electron beam by using a scanning electron microscope (SEM) (Hitachi S-4800) was a hydrophilic surface (water contact angle: 0°) and a portion other than the hydrophilic surface was a hydrophobic surface (water contact angle: about 110°). More specifically, an acceleration voltage was kept to 0.5 kV until reaching to a desired portion, and the acceleration voltage was kept to 1 to 20 kV after reaching to the desired portion. Exposure was performed by controlling a scanning speed and a combination of a beam current and scanning resolution by changing a magnitude of SEM. More specifically, the scanning was performed with a beam current of 10 μA, a scanning resolution of 1280×960, and electrons per scanning unit of 0.3 pC for 40 seconds.

Figure 3:
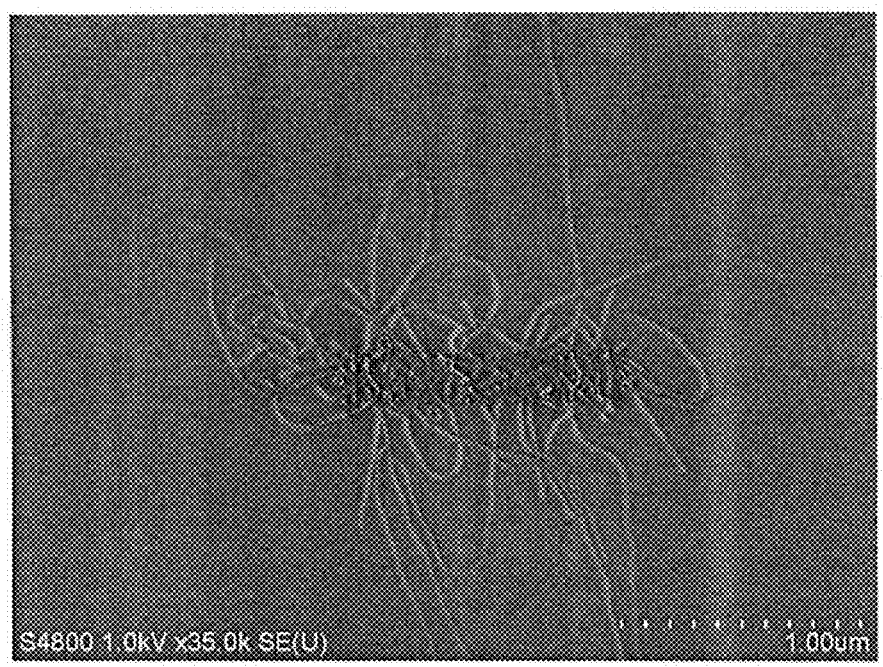
FIG. 3 shows an SEM image of two-dimensionally patterned single-walled carbon nanotubes of Example 2, in particular, single-walled carbon nanotubes having a single-walled carbon nanotube formation region line width: 200 nm.
Figure 4:
FIG. 4 shows an SEM image of two-dimensionally patterned single-walled carbon nanotubes of Example 2, in particular, single-walled carbon nanotubes having a single-walled carbon nanotube formation region line width: 50 nm.

Then, <Catalyst Coating Step> and <Step of CVD Growth of Single-walled carbon nanotube> of Example 1 were performed to obtain two-dimensionally patterned single-walled carbon nanotubes shown in FIGS. 3 and 4.

FIG. 3 shows that the single-walled carbon nanotubes have a catalyst portion line width (line width of portion exposed to electron beam) of 200 nm, and FIG. 4 shows that the single-walled carbon nanotubes have a catalyst portion line width (line width of portion exposed to electron beam) of 50 nm.

It was confirmed from a Figure, which is not shown in the present application, that an average diameter of the carbon nanotubes of each of FIGS. 3 and 4 was 1.5 nm. FIG. 4 shows that a minimum line width in a carbon nanotube formation region is about 50 nm. This example shows that it is possible to form a carbon nanotube formation region having a minimum line width of about 10 nm.

While illustrative embodiments have been illustrated and described, it will be appreciated that various changes can be made therein without departing from the spirit and scope of the invention.

The invention claimed is:

1. A method for producing a two-dimensionally patterned carbon nanotube, comprising the steps of:
    A) 1) preparing a substrate having a hydrophilic surface on its entire surface, and then 2) applying a surface hydrophobication solution, which comprises a silane compound represented by $R^1$—Si—$X^1_m X^2_{(3-m)}$, wherein $R^1$ represents an organic group having C10-20 linear or branched chain; $X^1$ and $X^2$ each represents —$OCH_3$ or —Cl; and m represents an integer of 0 to 3, on the hydrophilic surface, thereby to change an entire portion of the hydrophilic surface into a hydrophobic surface, thereby to obtain a substrate having the hydrophobic surface on its entire surface;
    B) 1) covering the substrate having the hydrophobic surface on its entire surface, with a mask and irradiating the substrate with an electromagnetic wave through the mask, or
    2) irradiating the substrate having the hydrophobic surface on its entire surface, with an electron beam, to form a substrate having a first two-dimensional pattern consisting of a hydrophobic surface and a hydrophilic surface on a surface of the substrate;
    C) applying a catalyst-containing liquid on the substrate having the first two-dimensional pattern, to form a second two-dimensional pattern, depending on the presence or absence of the catalyst, wherein the hydrophilic surface retains a monomolecular layer of the catalyst and the hydrophobic surface does not retain the catalyst; and
    D) forming a carbon nanotube on the resulting substrate by chemical vapor deposition under the presence of a carbon source, wherein the carbon nanotube is formed on the surface retaining the monomolecular layer of the catalyst and any carbon nanotube is not formed on the surface which does not retain the catalyst.

2. The method according to claim 1, wherein the step B) is covering the substrate having the hydrophobic surface on its entire surface, with a mask and irradiating the substrate having the hydrophobic surface on its entire surface, with an electromagnetic wave through the mask, thereby changing the hydrophobic surface which is not covered with the mask into a hydrophilic surface, and remaining a portion which is covered with the mask as the hydrophobic surface, to form the first two-dimensional pattern.

3. The method according to claim 1, wherein
    the step B) is irradiating the substrate having the hydrophobic surface on its entire surface, with an electron beam, thereby changing a portion irradiated with the electron beam into a hydrophilic surface, and remaining a portion which is not irradiated with the electron beam as the hydrophobic surface, to form the first two-dimensional pattern.

4. The method according to claim 1, wherein the step E)-1) further comprises a step E)-1)-1) of cleaning the surface of the substrate having the hydrophilic surface on its entire surface.

5. The method according to claim 4, wherein the step E)-1)-1) further comprises a step a) of sintering the substrate having the hydrophilic surface on its entire surface under the presence of oxygen at 300° C. or more.

6. The method according to claim 1, wherein the substrate prepared in the step A) is Si, quartz, crystal, or sapphire each having $SiO_2$ on its surface.

7. The method according to claim 1, wherein a hydrophilicity of the hydrophilic surface in the step B) is represented by a water contact angle of 10° or less.

8. The method according to claim 1, wherein a hydrophobicity of the hydrophobic surface in the step B) is represented by a water contact angle of 90° or more.

9. The method according to claim 1, wherein the electromagnetic wave irradiation in the step B)-1) is UV ray irradiation.

10. The method according to claim 1, wherein the catalyst-containing liquid in the step C) is an ethanol solution of a molybdenum salt and/or an ethanol solution of a cobalt salt.

11. The method according to claim 1, further comprising a step F) of sintering the substrate having the second two-dimensional pattern after the step C) and before the step D).

12. The method according to claim 11, wherein the step F) is performed under atmospheric environment at 300° C. or more.

13. The method according to claim 1, wherein the carbon source in the step D) is a lower alcohol, and the chemical vapor deposition is performed under a reduced pressure and a vapor deposition temperature of 500° C. or more.

14. The method according to claim 1, wherein the carbon nanotube is a few-walled carbon nanotube.

15. The method according to claim 1, wherein the carbon nanotube is a single-walled carbon nanotube.

16. The method according to claim 1, wherein an axis direction of the carbon nanotube is aligned perpendicular to the substrate.

17. The method according to claim 1, wherein an axis direction of the carbon nanotube is aligned parallel to the substrate.

18. The method according to claim 1, wherein the carbon nanotube has an average diameter of 3 nm or less.

19. The method according to claim 1, wherein the two-dimensionally patterned carbon nanotube has 300 nm or less of a possible-smallest-line-width at a portion where the carbon nanotube is disposed, while a possible-smallest-line-width at a portion where the carbon nanotube is not disposed is 300 nm or less.

20. The method according to claim 1, wherein the silane compound is selected from the group consisting of undecyltrichlorosilane, tetradecyltrichlorosilane, octadecyltrichlorosilane, octadecyltrimethoxysilane, octadecylmethoxydichlorosilane, and n-dodecyltrimethoxysilane.

21. The method according to claim 1, wherein a solvent of the surface hydrophobication solution is selected from the group consisting of toluene, hexane, and heptane.

22. The method according to claim 1, wherein the surface hydrophobication solution is a solution of octadecyltrichlorosilane in toluene.

\* \* \* \* \*